United States Patent
Jain et al.

(10) Patent No.: US 7,281,225 B2
(45) Date of Patent: Oct. 9, 2007

(54) CIRCUIT VERIFICATION USING MULTIPLE ENGINES

(75) Inventors: Jawahar Jain, Santa Clara, CA (US); Koichiro Takayama, Tokyo (JP); Debashis Sahoo, Stanford, CA (US)

(73) Assignee: Fujitsu Limited, Kawasaki (JP)

( * ) Notice: Subject to any disclaimer, the term of this patent is extended or adjusted under 35 U.S.C. 154(b) by 373 days.

(21) Appl. No.: 10/996,706

(22) Filed: Nov. 22, 2004

(65) Prior Publication Data
US 2005/0138474 A1 Jun. 23, 2005

Related U.S. Application Data

(60) Provisional application No. 60/523,902, filed on Nov. 20, 2003.

(51) Int. Cl.
*G06F 17/50* (2006.01)
(52) U.S. Cl. ............................................. 716/5; 716/4
(58) Field of Classification Search ................ 716/4–6
See application file for complete search history.

(56) References Cited

U.S. PATENT DOCUMENTS

| | | | | |
|---|---|---|---|---|
| 6,026,222 | A * | 2/2000 | Gupta et al. .................... | 716/5 |
| 6,421,808 | B1 * | 7/2002 | McGeer et al. ................. | 716/1 |
| 6,816,825 | B1 * | 11/2004 | Ashar et al. .................... | 703/14 |
| 7,028,279 | B2 * | 4/2006 | Jain et al. ........................ | 716/5 |
| 7,065,726 | B1 * | 6/2006 | Singhal et al. .................. | 716/5 |

OTHER PUBLICATIONS

Biere et al., "Symbolic Model Checking without BDDs," Lecture Notes in Computer Science, 1579:193-207, 18 pages, Jan. 4, 1999.
Bloem et al., "Symbolic Guided Search for CTL Model Checking," In DAC, 6 pages, 2000.
Boppana et al., "Model Checking Based on Sequential ATPG. In ICCAD," pp. 418-430. Springer-Verlag, 11th International Conference, Jul. 6-10, 1999.
Bryant, "Graph-based Algorithms for Boolean Function Manipulation," IEEE Transactions Computers, C-35-8, 677-691, 29 pages, 1986.
Clarke et al., "Design and Synthesis of Synchronization Skeletons Using Branching Time Temporal Logic," In Proc. IBM Workshop on Logics of Programs, vol. 131 of LNCS, pp. 52-71, Springer-Verlag, 1981.
Coudert et al. "Verification of Sequential Machines Based on Symbolic Execution," In Proc. of the Workshop on Automatic Verification Methods for Finite State Systems, Grenoble, France, 1989.
Garavel et al., "Parallel State Space Construction for Model-Checking," In SPIN workshop on model checking of software, pp. 217-234. Springer-Verlag New York, Inc., 2001.
Heyman et al., "Achieving Scalability in Parallel Reachability Analysis of Very Large Circuits," In CAV, 19 pages, May 30, 2000.
Jain, "On Analysis of Boolean Functions," Ph.D Dissertation, Dept. of Electrical and Computer Engineering, The University of Texas at Austin, 1993.

(Continued)

*Primary Examiner*—Jack Chiang
*Assistant Examiner*—Binh Tat
(74) *Attorney, Agent, or Firm*—Baker Botts L.L.P.

(57) ABSTRACT

In one embodiment, a method for circuit verification using multiple engines includes running multiple traces on a circuit using multiple reachability algorithms, selecting an effective reachability algorithm for the circuit from among the multiple reachability algorithms according to a comparison of results of the multiple traces with each other, generating a set of initial states for the selected effective reachability algorithm using states reached in the plurality of traces, and executing the selected effective reachability algorithm using the generated set of initial states to verify the circuit.

21 Claims, 2 Drawing Sheets

OTHER PUBLICATIONS

McMillan, "Symbolic Model Checking," Kluwer Academic Publishers, 1993.
Narayan et al., "Reachability Analysis Using Partitioned-ROBDDs," In Proc. of the Intl. Conf. on Computer-Aided Design, pp. 388-393, 1997.
Stern et al., "Parallelizing the Murphy Verifier," In CAV, pp. 1-12, 1997.
Stornetta et al., Implementation of an Efficient Parallel BDD Package,: In DAC, pp. 641-644, 50 pages, 1996.
Yang et al., "Parallel Breadth-First BDD Construction," In symposium on Principles and practice of parallel programming, pp. 145-156. ACM Press, 12 pages, 1997.
Cabodi et al., "Symbolic Exploration of Large Circuits with Enhanced Forward/Backward Traversals," In EuroDAC, 6 pages, 1994.
Cabodi et al., "Mixing Forward and Backward Traversals in Guided-Prioritized BDD-Based Verification," In CAV, pp. 471-484, 2002.
Chauhan et. al., "Non-Linear Quantification Scheduling in Image Computation," In ICCAD, 6 pages, 2001.
Clarke et al., "Design and Synthesis of Synchronization Skeletons Using Branching Time Temporal Logic," vol. 131 of LNCS, unknown.
Govindaraju et al., "Verification by Approximate Forward and Backward Reachability," In ICCAD, 5 pages, 1998.
Iyer et al., "Improved Symbolic Verification Using Partitioning Techniques," In Proc. of CHAR ME, vol. 2860 of Lecture Notes in Computer Science, pp. 411-424, 2003.
Jain et al., "Functional Partitioning for Verification and Related Problems," Brown/MIT VLSI Conference, 1992, [II] K. L. McMillan. Symbolic Model Checking. Kluwer Academic Publishers, 1993.
Moon et al., "To Split or to Conjoin: The Question in Image Computation," In DAC, 6 pages, 2000.
Somenzi., "UDD: CU Decision Diagram Package," ftp://vlsi.colorado.edulpub, 2001.
VIS. Verilog Benchmarks http://vlsi.colorado.edul- vis/, unknown.
Wang et al., The Compositional Far Side of Image Computation. In ICCAD, 2003.

* cited by examiner

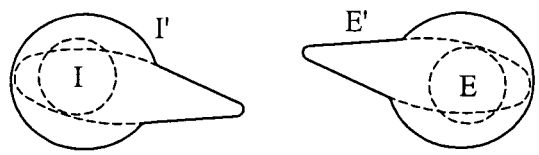
*FIG. 3A*
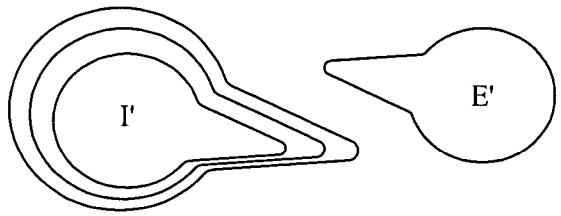
*FIG. 3B*
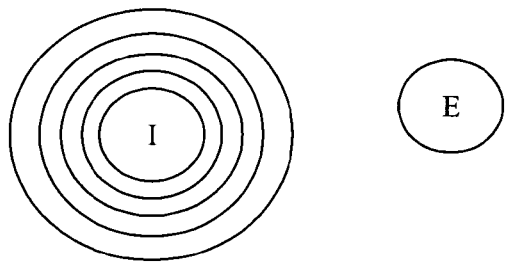
*FIG. 3C*
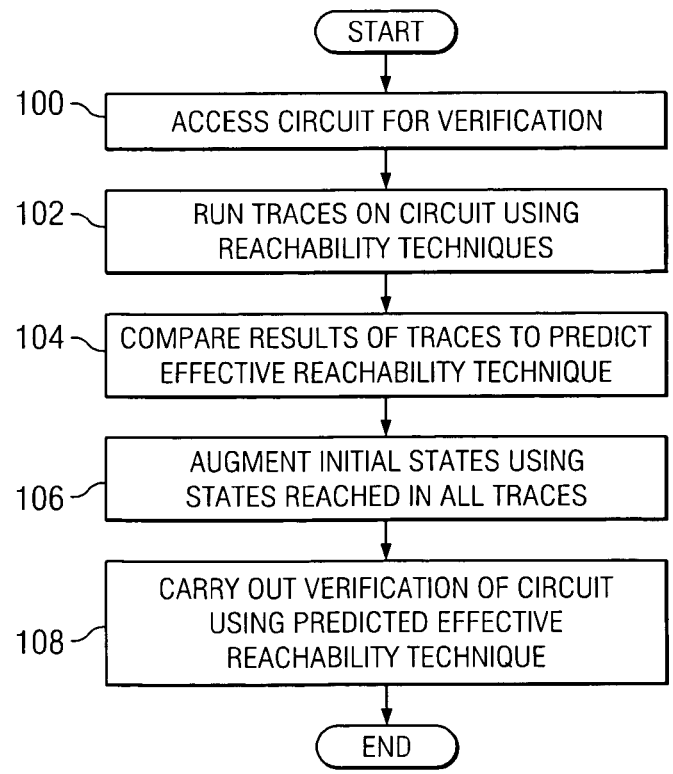

CIRCUIT VERIFICATION USING MULTIPLE ENGINES

RELATED APPLICATION

This Application claims the benefit, under 35 U.S.C. § 119(e), of U.S. Provisional Application No. 60/523,902, filed Nov. 20, 2003.

TECHNICAL FIELD

This disclosure relates generally to circuit verification and more particularly to circuit verification using multiple engines.

BACKGROUND

Unbounded model checking of invariant properties is typically solved using symbolic reachability. However, BDD-based reachability methods tend to suffer from inconsistency in performance, making it difficult to identify a particular method for a given problem.

SUMMARY

The present invention may reduce or eliminate disadvantages, problems, or both associated with circuit verification.

In one embodiment, a method for circuit verification using multiple engines includes running multiple traces on a circuit using multiple reachability algorithms, selecting an effective reachability algorithm for the circuit from among the multiple reachability algorithms according to a comparison of results of the multiple traces with each other, generating a set of initial states for the selected effective reachability algorithm using states reached in the plurality of traces, and executing the selected effective reachability algorithm using the generated set of initial states to verify the circuit.

Particular embodiments of the present invention may provide one or more technical advantages. As an example, particular embodiments examine a few short traces of computation to reconcile various methods of reachability. Particular embodiments provide automatic, robust, and modular examination of traces of computation to reconcile various methods of reachability. Particular embodiments intelligently integrate diverse reachability techniques to potentially enhance the efficiency of the techniques. Particular embodiments are, in many cases, orders of magnitude more efficient than previous reachability algorithms. Particular embodiments may complete all invariant checking properties in VIS-Verilog benchmarks. Particular embodiments are fully automatic and require no manual interventions once started. Particular embodiments provide an automatic self-tuning trace-based approach to address the inconsistency in performance of BDD-based reachability techniques. Particular embodiments, without any manual intervention, combine the advantages of reach ability analysis in both forward and backward directions, using both unpartitioned as well as partitioned state space representations. Such embodiments may efficiently and automatically complete invariant checking on all circuits of VIS-Verilog benchmark. Such embodiments may also be fully modular and easily enhanced to include other verification approaches, for example, satisfiability-based approaches like BMC.

Particular embodiments of the present invention provide all, some, or none of the above technical advantages. Particular embodiments may provide one or more other technical advantages, one or more of which may be readily apparent to a person skilled in the art from the figures, description, and claims herein.

BRIEF DESCRIPTION OF THE DRAWINGS

To provide a more complete understanding of the present invention and the features and advantages thereof, reference is made to the following description taken in conjunction with the accompanying drawings, in which:

FIGS. 3A-3C illustrate frontier augmentation improving performance on passing properties; and FIG. 4 illustrates an example method for circuit verification using multiple engines.

DETAILED DESCRIPTION OF THE DRAWINGS

Figure 1:
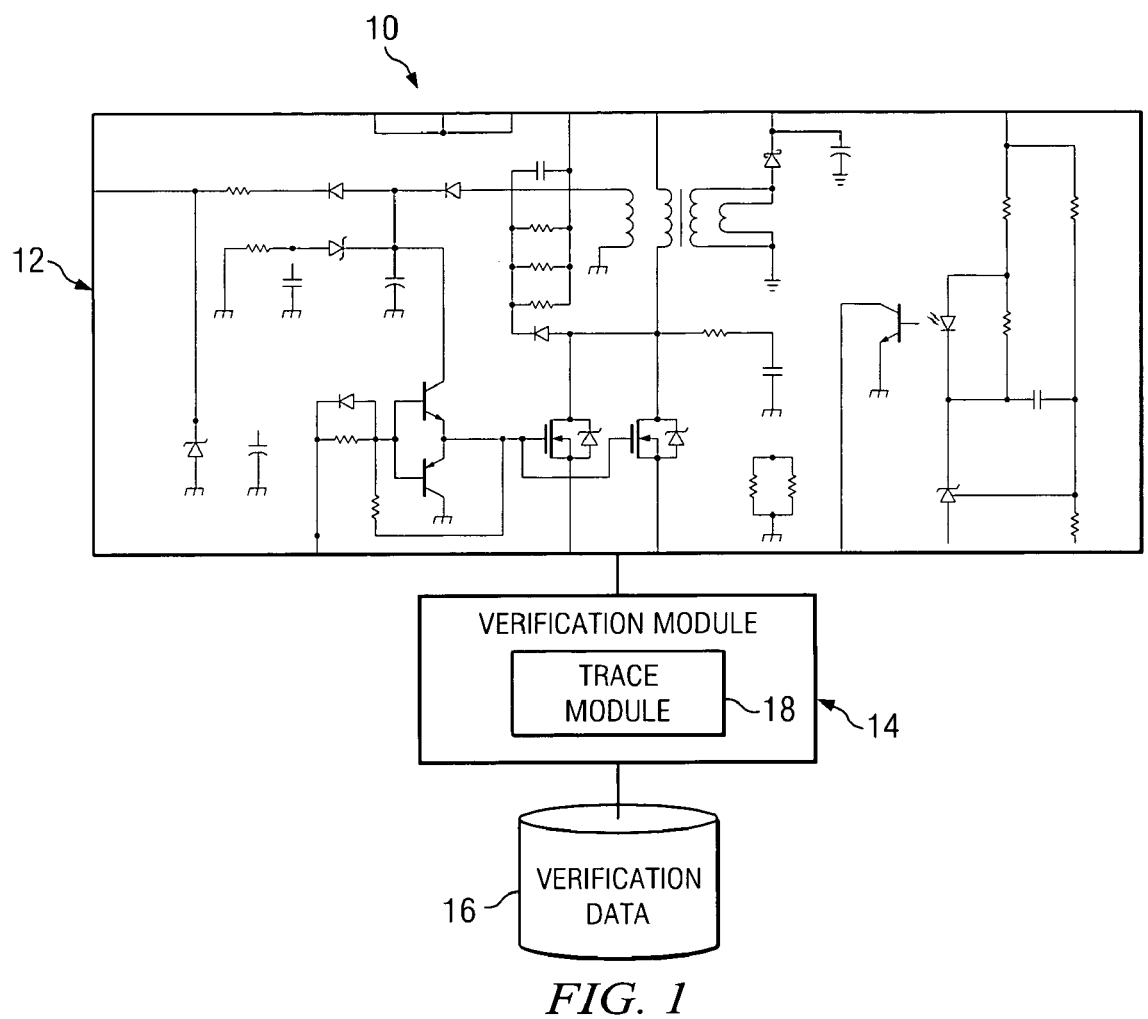
FIG. 1 illustrates an example system for circuit verification using multiple engines.

FIG. 1 illustrates an example system 10 for circuit verification using multiple engines. System 10 includes circuit 12 for verification and a verification module 14 and verification data 16 for verifying circuit 12, as described below. One or more links couple components of system 10 to each other. As an example and not by way of limitation, a link may include one or more wires in one or more circuit boards, one or more internal or external buses, one or more local area networks (LANs), one or more metropolitan area networks (MANs), one or more wide area networks (WANs), one or more portions of the Internet, or a combination of two or more such links, where appropriate.

Circuit 12 includes hardware or a logical or other representation of hardware for testing to determine whether the hardware operates properly, e.g., according to one or more particular specifications corresponding to the hardware. As an example and not by way of limitation, circuit 12 may include circuit components such as gates, counters, inverters, buffers, and other circuit components arranged and coupled to each other to provide particular functionality. As another example, circuit 12 may include a logical or other representation of such components. Circuit 12 may include millions of circuit components. To provide a particular functionality, circuit 12 may need to include one or more properties. Circuit 12 may need to include millions of such properties. In particular embodiments, one or more logical expressions may describe a property of circuit 12. Reference to a "property" of circuit 12 may encompass a logically expressible state, characteristic, behavior, or operation of circuit 12 or another property of circuit 12.

Verification module 14 includes a hardware, software, or embedded logic component or a combination of two or more such components for accessing circuit 12 via one or more links and verifying circuit 12, as described below. In particular embodiments, verifying circuit 12 includes testing circuit 12 to determine whether circuit 12 includes one or more particular properties. As an example and not by way of limitation, testing circuit 12 to determine whether circuit 12 includes one or more particular properties may include identifying states in circuit 12, as described below. Verification module 14 includes a trace module 18. Trace module 18 includes a hardware, software, or embedded logic component or a combination of two or more such components for executing a trace-based algorithm, as described below. Verification data 16 includes data specifying a type of circuit 12 and other data that, in particular embodiments, verification module 14 uses to verify circuit 12. In particular embodiments, one or more computer systems provide user access to verification module 14 and verification data 16. As an example and not by way of limitation, one or more computer systems may include verification module 14 and verification data 16 and a user may access the one or more computer systems to provide input to and receive output from verification module 14 and verification data 16.

A common approach to formal verification of hardware is checking invariant properties of the design. Unbounded model checking of invariants is usually performed by doing a reachability analysis. This approach finds all the states reachable from the initial states and checks if the invariant is satisfied in these reachable states. These approaches suffer from state explosion for representing large state sets. Reachability analysis is typically done using Reduced Ordered Binary Decision Diagrams (OBDDs). A more compact representation of Boolean functions, Partitioned OBDDs (POBDDs) leads to further improvement in reachability analysis.

BDD-based reachability methods suffer from wild inconsistency in performance, making it difficult to estimate which method should be adopted for a given problem. Particular embodiments analyze four different ways of doing reachability analysis: forward or backward reachability using partitioned or unpartitioned BDDs for state set representation. It is often the case that though one method can compute reachability easily, the others find it very difficult. Particular embodiments provide an automatic strategy to determine a more effective method by running a few short traces of the above methods. These traces provide a short initial sampling of the performance of the various methods by observing the initial computations until a predefined cutoff in BDD size is reached. This approach determines the best direction for reachability analysis as well as the effectiveness of performing state space partitioning. Each method has its own domain of applicability. Particular embodiments benefit from the strengths of each method. At the end of the independently run traces, particular embodiments allow all their computations to be shared, which may significantly enhance the performance of each technique.

The above intuitive observations are strongly validated empirically as well. The techniques result in a very robust method which often has dramatic gain in verification time over other approaches. We efficiently and automatically finish all the invariant checking properties of the VIS-Verilog benchmark suite. This approach is modular and other BDD/SAT-based methods can be easily incorporated as part of the trace-centric analysis, and ultimately a part of our framework. The inherent stability of our method and its more or less freedom from parametric sensitivity, a well known bete noire of BDD based methods, leads us to believe that such an integration was sorely needed.

In the field of BDD based falsification, large invariant checking problems are often addressed using approximations, partitioning, guided searches and mixing forward and backward reachability. An approximation method using overlapping projections to symbolic backward reachability has been proposed. The advantage of this method is that it is very fast; but it does not give a very exact solution. A guided search method using hints has also been proposed. This method requires manual intervention, since its efficiency requires good hints from the user. Several methods to mix forward and backward approximate and exact traversals, guided search have also been proposed. At least one such method uses partitioning of a state space of a circuit 12 and prioritizes the partitions based on their estimated distance from a target set of states. The method uses approximate forward reachability to improve the exact backward reachability for invariant checking. However, the method does not take advantage of the cases where exact forward reachability is effective. If the exact backward reachability becomes very expensive, such an approach may become quite inefficient.

Let B denote the set $\{O, I\}$. Let $M=(S, \Sigma, \delta, S_0, \lambda)$ be a non-deterministic finite state machine, where $S \subseteq B^n$ is the state space, $S \subseteq B^m$ is the input space, $\delta: S \times \Sigma \to 2^S$ is next state function, $S_0$ is the set of initial states and $\lambda: S \to B^k$, is the output function. The number of state elements, number of inputs and number of outputs of the finite state machine (FSM) is n, m, k respectively. The transition relation T(s, e, s') is defined as a function from $S \times \Sigma \times S^n$ to B, where $S \subseteq B^n$ and T(s, e, s')=1 iff $s' \in \delta(s, e)$. The transition relation is often represented by T(s, e, s')=

$$\prod_{i=0}^{n} \left( s'_i = f_i(s, e) \right),$$

in which $f_i(s, e)$ is the function for $i^{th}$ state element. The next set of states N(s') reachable from the given states R(s) is computed as $N(s')=\exists s.eR(s) \wedge T(s, e, s')$. This step is known as Forward Image Computation. The Backward Image Computation is referred to as the computation of all the states R(s) whose next states belongs to the given set of states N(s'), i.e. $R(s)=\exists s'.eN(s') \wedge T(s, e, s')$. In BDD-based verification the transition relation T(s, e, s'), the state functions R(s) and N(s') are represented by BDDs. The image computation is often a major bottleneck in verification. Often, the transition relation becomes too large for the image computation. Instead, the transition relation is represented as a partitioned transition relation, i.e., a set of BDDs whose conjunctions equal the transition relation. These conjunctions are delayed until the image computation. A technique that often reduces the intermediate BDDs, called early quantification, is applied during the image computation.

Forward reachability is done by repeated application of forward image computation to the initial states until a fixed point is reached. The given invariant property, P(s), is checked during the reachability analysis. The invariant passes if the total reachable states $R(s) \subseteq P(s)$ and fails otherwise. Backward reachability is done by repeated application of backward image computation from the set S-P(s). The invariant passes if the total backward reachable set of states doesn't include any initial states and fails otherwise. During reachability analysis the BDD that represents the reachable state set becomes so large that it is impossible to do image computation. POBDD-based forward reachability addresses this problem by using POBDDs for disjunctive state space partitioning. A similar approach can be adopted for doing POBDD-based backward reachability in addition to the conjunctive partitioning of the transition relation described above. Herein, "partitioning" encompasses such state space partitioning, where appropriate.

Reachability is a difficult problem for a large number of practical cases. Reference to a "case" may encompass one or more circuits 12 of a particular type, where appropriate. Given any reachability algorithm, there can be some cases to which the reachability algorithm is ill suited. Therefore, all state-space exploration methods are bound to fail on many cases. The domain of effectiveness for different reachability methods are often disjoint. As an example and not by way of limitation, consider the following characteristics of forward, backward, and partitioned state space traversal:

Forward Traversal: Forward traversal explores the state space from a set of initial states. It uses the invariant property for checking whether the new states explored satisfy it. Forward traversal seems more effective usually if the reachable states have a very structured representation. The forward traversal is not benefited by a simple or complex property. It will find the total reachable space if there is a passing property.

Backward Traversal: Backward reachability is more dependent on the property because it starts exploring from the part of state space that doesn't satisfy the property. So it explores the relevant part of the state space that is needed for the proof. On the other hand many of these states are not reachable from the initial states. If a system has too many unreachable states—as is often the—case and it is very hard to represent it by a BDD, then backward reachability is not effective.

Partitioned Traversal: Partitioned forward and backward reachability can explore deeper states and large part of the state space quickly, if it finds a good partition of the circuit. If there is no good partition of the circuit, then partitioned reachability would be worse than the corresponding monolithic reachability due to the overhead involved in partitioning.

Now, consider a reachability method M. Invariant checking using M may be categorized using three different axes: (a) property passes or fails; (b) reachability is shallow or deep; and (c) involved computations are easy or hard. Easy cases do not really pose a problem. Particular embodiments provide improvements for the remaining problems, i.e., hard cases. A reachability problem is typically hard when it requires very large graphs or very large number of steps. However, as described above, different approaches may have a very complementary nature. Thus, a problem may generate graph blowup or deep reachability calculations in forward reachability while, for the backward reachability, the problem may generate very small graphs or very small number of image computations before a fixed point is reached. Due to this very real possibility of mapping a very hard reachability problem in method M to a much simpler instance in an different reachability method, it may be inefficient to stay with the same method when the method is continually proving to be very expensive.

More specifically, given method M, if depth and the blowup being generated in a particular reachability instance are monitored, then, when it is determined that the given execution of M is showing potential to prove difficult, switching to another orthogonal reachability method should be considered. By using a complementary method, a reachability instance with BDD blowup may often get mapped to another which requires only small-BDDs. Similarly a deep case may be mapped to a shallow instance of reachability. Thus, even though there may be a BDD blowup, it may remain relatively more tractable due to a smaller number of BDD computations. Since both deep cases (the failing properties) or passing cases are problems for traditional Satisfiability (SAT) Bounded Model Checking (BMC), particular embodiments use such avenue for improving unbounded model checking of formulas. Hence, though time or space improvements in the basic reachability calculations of some method M can improve solutions of various unbounded model checking problems, an attractive option is being able to dynamically, as well as suitably, change the method being employed. Particular embodiments consider four different approaches: the classical monolithic forward reachability, backward monolithic reachability, partitioned forward reachability, and partitioned backward reachability. Particular embodiments then employ trace-centric heuristics to predict which method is effective, as described below.

A first question is which method out of many should be selected and, if multiple methods are being used, when should one switch from one to another. A second question is what happens to the computations already performed for the aborted methods. If such computation goes unused, an approach relying on dynamic switching may often prove very expensive. To address the first question, particular embodiments provide a simple strategy based on running each method until a predefined cutoff threshold is exceeded and then automatically choosing a winning method according to certain predefined criteria. To address the second question, regarding wastefulness of overlapping redundant computation, particular embodiments enhance performance of the finally chosen reachability method from the computations performed by the aborted methods.

In particular embodiments, a trace-based algorithm predicts an effective method. A trace for an algorithm is a short initial computation using that algorithm. The trace-based algorithm runs one trace each of the backward and forward partitioned reachability followed by forward and backward symbolic monolithic (non-partitioned) reachability. In particular embodiments, this order is used because backward reachability and partitioning tend to be more suitable for finding bugs. The traces are run until a predefined size cutoff is exceeded. In particular embodiments, this cutoff is small enough to allow efficient performance of symbolic operations and is set at a fixed multiple of the representation size of the state transition relation. Empirically, a range between 4 to 6 times the size of transition relation tends to lead to a reasonably deep but not very expensive trace. In particular embodiments, the cutoffs are based on size rather than time. In the case of computations where there is hardly any blowup, a single trace may be enough to complete the computation. In particular embodiments, if any of the traces is able to determine whether the invariant passes or fails, then the method immediately terminates. Similarly, if the state sets of a forward and a backward trace intersect, then the given invariant has been shown to fail.

If the traces themselves do not finish the computation, they are used to predict the most effective approach for the rest of the computation. First, the appropriate direction is determined from the traces of symbolic forward and backward reachability. Intuitively the number of images completed within a threshold of BDD nodes gives a measure of how effectively the reachability computation is proceeding. Therefore, particular embodiments use the number of images completed as measure for deciding the most effective method. If the difference between the number of images computed in the two directions is small, e.g., plus or minus one, then the algorithm cannot distinguish the preferred method effectively. Particular embodiments then have the option of using a default method, e.g., forward reachability or running the traces again with a larger threshold. If a direction cannot be determined after a few attempts, then the forward direction can be chosen as the default.

After selecting the direction, the trace-based algorithm tries to predict whether partitioned reachability is more effective than the monolithic approach, where state sets are represented as single BDDs. This may be done by considering the number of states reached by traces run using both approaches in the selected direction. If the total number of reachable states explored by either method is significantly better than that of the other method, then a winning method has been found. If this number is comparable for both approaches, then a meaningful metric to break the tie seems to be the rate of coverage defined as number of states covered versus corresponding time. In this manner, the traces are used to pick a method that is likely to be the most effective method.

It may seem that the repeated overlapping computations performed by the various traces are wasted. To avoid this, after deciding the effective method, the trace-based algorithm augments the initial states and the invariant by adding the states reached by all traces. In the forward direction, the reachability analysis starts from the union of the reached states using both forward traces. Likewise, the error set, which is set of states that satisfy the negation of the invariant, is replaced by the union of the sets states reached by the two backward traces. If the direction of computation is backward, then the error states are the start set and the augmented initial states are the target, which allows the computations performed by the traces to be reused.

Figure 2:
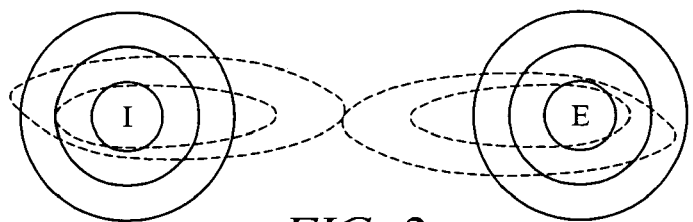
FIG. 2 illustrates an example traversal of states.

FIG. 2 illustrates an example traversal of states, with traces in forward and backward directions with and without state-space partitioning. The concentric circles represent forward and backward monolithic (non-partitioned) traces. The ovals represent partitioned forward and backward reachability traces. For failing invariant properties, the erroneous states are reachable from the initial states. Sometimes the forward and backward traces intersect each other as illustrated in FIG. 2. For this case, the trace-based algorithm halts and reports the failing result. Otherwise, the trace-based algorithm runs the selected method until an intersection with the reachable set of other direction is obtained. Hence, the invariant augmentation is useful for the failing case.

The frontier augmentation may facilitate improvement of performance of the method on passing properties illustrated in FIGS. 3A-3C. FIG. 3A illustrates augmenting initial and error sets after traces. FIG. 3B illustrates convergence of reachability. FIG. 3C illustrates reachability without augmentation. In FIG. 3A, the circle represents the BFS trace and the ellipses are the traces of partitioned reachability. FIGS. 3B and 3C include the same set R of reachable states. For the same set of states, FIG. 3B converges faster than FIG. 3C. For a passing invariant, all reachable states have to be explored to confirm that no violation is detected. This can be done by, for example, a breadth-first search (BFS) as illustrated in FIG. 3C. If the set of initial states I is augmented by the states reached by different methods. Now, the augmented initial set I' can have states that are deeper than the states reached by performing forward reachability. Intuitively, if a depth-first search (DFS) method added a significant number of new states, then the number of steps required for reachability to converge using a BFS from this set I' may be smaller, as illustrated in FIG. 2B or the reachability itself may become more efficient.

In particular embodiments, each engine may be run simultaneously, i.e., in parallel, in a parallel computing environment. When one of the engine finishes, the rest of the runs may be terminated. In a parallel environment, the frontier augmentation techniques may allow partial results of intermediate computations of one method to facilitate another method. As an example and not by way of limitation, POBDD frontier may be added to augment the monolithic OBDD frontier. If enough processors are available, each POBDD frontier (from each partition) may be used to augment the monolithic frontier. Each of these augmented frontiers may be run in parallel using available processors.

In particular embodiments, the frontiers of forward and backward runs may be used in this way so that, each time and frontier is computed, it is intersected with last computed frontier in the reverse direction. This may reduce time requirements associated with locating the errors. A separate processor may be kept free or scheduled in the existing environment. If a BMC run has already finished K runs and the BDD runs have only gone K' deep, where K is significantly greater than K', the BDD runs may be terminated and processors freed up for BMC.

One or more POBDD frontiers may go very deep, while one or more other POBDD frontiers become stuck. In this case, the POBDD frontiers of deep partitions may be used to start BMC runs in parallel. As an example and not by way of limitation from each frontier of a partition a SAT-BMC run may be started. This way, numerous independent BMC runs may be started. Instead of taking all states in the frontier, a subset of states may be used a n as initial state, which may gives a user flexibility to take as initial states only states tending not to pose a problem to SAT-BMC.

Particular embodiments provide an efficient methodology for using multiple engines in formal verification. FV is often very difficult. In worst case scenarios (P-space complete or NP-complete), FV problems may be intractable. Previous techniques for dealing with FV problems include deterministic automatic test pattern generation (ATPG), nondeterministic ATPG, forward reachability (using BDDs or POBDDs), preimage techniques (using BDDs or POBDDs), SAT-BMC techniques, induction-based BMC techniques, and other techniques. Engines using one or more of these techniques are typically orthogonal and, therefore, have their own domains of applicability. Often, each of these engines must be used. However, it is often unclear which technique should be applied in a particular case. Particular embodiments may make such a decision automatically.

According to a previous engine methodology, there are six cases that are each defined by circuit size (large, medium, or small) and depth of state space (deep or shallow). Depth of state space encompasses forward-reachability depth. In a first case (large circuit and deep state-space), a POBDD-BMC technique is typically used, but provides only a semiformal solution. Guided semiformal verification or preimage based on ATPG can alternatively be used. For abstraction, RTL solvers can be used. BDDs are often unable to process very large circuits. In a second case (large circuit and shallow state-space), an ATPG-based falsifier is used. If no fault is located, induction-based BMC is then used. The order of use of the ATPG-based falsifier and induction-based BMC is reversible.

In a third case (small circuit and shallow state-space), a fast falsifier using an ATPG and POBDD technique is typically used. If no error is located, a BDD, SAT-BMC, or POBDD technique is then used. A fourth case (small circuit and deep state-space) includes two subcases. A first subcase includes difficult functions. POBDDs are typically used to process these functions. A second subcase includes less difficult functions. POBDDs (and sometime OBDDs) are typically used to process these functions. In a fifth case (medium circuit and shallow state-space), a BMC technique is often preferable. There are two subcases. A first subcase includes difficult functions. These functions often prove intractable, but SAT-BMC techniques generally work on these functions. A second subcase includes less difficult functions. A BMC technique is often preferable for processing these functions. A sixth case (medium circuit and deep state-space) includes two subcases. A first subcase includes difficult functions. These functions are often intractable, and a deep BMC technique is typically an only option. A second subcase includes less difficult functions. A POBDD technique is typically an only technique that is scalable with respect to these functions.

Previous FV techniques typically rely on forward reachability. In addition, previous techniques often try to prove assertions to be true, which may often be impractical. Particular embodiments provide a more effective methodology. In particular embodiments, if an unreachable state space appears small, an ATPG technique may be used to locate errors. If the unreachable state-space is in fact small, a preimage-based falsification technique may also be used. For large circuits, the ATPG-based falsification technique may be used alone. If the ATPG-based falsification technique is unable to locate errors, one or more previous techniques may be used. ATPG-based methods generate substantial guidance during a test generation process. Some of these methods may be used to estimate a difficulty of a fault. In particular embodiments, research may be conducted at this point to make guidance specific to a particular unreachable state space more accurate for verification purposes. Conceptually, if the formula P=1 is the property, P=0 requires setting an output of an OR gate to zero. Logically, this may prove difficult if the OR gate has multiple inputs or if, in the fan-in cone of P, most cases are difficult to execute. Some of these ATPG-based methods may be executed using sequential learning. Particular embodiments may reduce time requirements associated with FV. In particular embodiments, a 100× to 1000× gain may be obtained over previous techniques. Particular embodiments may provide solutions to both scalability and stability problems.

FIG. 4 illustrates an example method for circuit verification using multiple engines. The method begins at step 100, where verification module 14 accesses circuit 12 for verification. At step 102, verification module 14 runs traces on circuit 12 using various reachability techniques. At step 104, verification module 14 compares results of the traces with each other to predict an effective reachability technique for circuit 12. At step 106, verification module augments initials states for the predicted effective reachability technique using states reach in all traces run at step 102. At step 108, verification module carries out verification of circuit using the predicted effective reachability technique and the augmented initial states, at which point the method ends.

Although this disclosure has been described in terms of certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure.

What is claimed is:

1. A method comprising:

running a plurality of traces on a circuit using a plurality of reachability algorithms, each reachability algorithm executing at a different one of a plurality of engines, each trace using a different reachability algorithm and running until the trace reaches a predetermined binary decision diagram (BDD) size threshold;

selecting an effective reachability algorithm for the circuit from among the plurality of reachability algorithms according to a comparison of results of the plurality of traces with each other;

generating a set of initial states for the selected effective reachability algorithm using states reached in the plurality of traces; and executing the selected effective reachability algorithm using the generated set of initial states to verify the circuit.

2. The method of claim 1, wherein the plurality of reachability algorithms comprise:

a backward partitioned reachability algorithm;

a forward partitioned reachability algorithm;

a forward symbolic monolithic reachability algorithm; and a backward symbolic monolithic reachability algorithm.

3. The method of claim 2, wherein the plurality of reachability algorithms further comprise:

a parallel forward reachability algorithm; and a parallel backward reachability algorithm.

4. The method of claim 2, wherein selecting the effective reachability algorithm comprises selecting an effective direction of the effective reachability algorithm according to a comparison of a number of image computations completed in each of the plurality of traces with each other.

5. The method of claim 4, wherein, if the comparison of the number of image computations completed in each of the plurality of traces with each other does not clearly identify an effective direction, selecting the effective reachability algorithm comprises selecting a default direction for the effective reachability algorithm.

6. The method of claim 5, wherein the default direction is forward.

7. The method of claim 4, further comprising, if the comparison of the number of image computations completed in each of the plurality of traces with each other does not clearly identify an effective direction, rerunning the plurality of traces on the circuit until the plurality of traces reach predefined transition relation (TR) size cutoffs that are larger than prior predefined TR size cutoffs for terminating the plurality of traces.

8. The method of claim 4, wherein selecting the effective reachability algorithm further comprises selecting a partitioned or monolithic approach for the effective reachability algorithm according to a number of states reached in each of the traces in the selected effective direction with each other.

9. The method of claim 1, further comprising terminating the plurality of traces when the plurality of traces reach predefined transition relation (TR) size cutoffs.

10. The method of claim 1, further comprising generating the set of initial states for the selected effective reachability algorithm using all states reached in the plurality of traces.

11. Logic encoded in one or more media for execution and when executed operable to:

run a plurality of traces on a circuit using a plurality of reachability algorithms, each reachability algorithm executing at a different one of a plurality of engines, each trace using a different reachability algorithm and running until the trace reaches a predetermined binary decision diagram (BDD) size threshold;

select an effective reachability algorithm for the circuit from among the plurality of reachability algorithms according to a comparison of results of the plurality of traces with each other;

generate a set of initial states for the selected effective reachability algorithm using states reached in the plurality of traces; and execute the selected effective reachability algorithm using the generated set of initial states to verify the circuit.

12. The logic of claim 11, wherein the plurality of reachability algorithms comprise:

a backward partitioned reachability algorithm;

a forward partitioned reachability algorithm;

a forward symbolic monolithic reachability algorithm; and a backward symbolic monolithic reachability algorithm.

13. The logic of claim 12, wherein the plurality of reachability algorithms further comprise:

a parallel forward reachability algorithm; and a parallel backward reachability algorithm.

14. The logic of claim 12, wherein selecting the effective reachability algorithm comprises selecting an effective direction of the effective reachability algorithm according to a comparison of a number of image computations completed in each of the plurality of traces with each other.

15. The logic of claim 14, wherein, if the comparison of the number of image computations completed in each of the plurality of traces with each other does not clearly identify an effective direction, selecting the effective reachability algorithm comprises selecting a default direction for the effective reachability algorithm.

16. The logic of claim 15, wherein the default direction is forward.

17. The logic of claim 14, further operable, if the comparison of the number of image computations completed in each of the plurality of traces with each other does not clearly identify an effective direction, to rerun the plurality of traces on the circuit until the plurality of traces reach predefined transition relation (TR) size cutoffs that are larger than prior predefined TR size cutoffs for terminating the plurality of traces.

18. The logic of claim 14, wherein selecting the effective reachability algorithm further comprises selecting a partitioned or monolithic approach for the effective reachability algorithm according to a number of states reached in each of the traces in the selected effective direction with each other.

19. The logic of claim 11, further operable to terminate the plurality of traces when the plurality of traces reach predefined transition relation (TR) size cutoffs.

20. The logic of claim 11, further operable to generate the set of initial states for the selected effective reachability algorithm using all states reached in the plurality of traces.

21. A system comprising:

means for running a plurality of traces on a circuit using a plurality of reachability algorithms, each reachability algorithm executing at a different one of a plurality of engines, each trace using a different reachability algorithm and running until the trace reaches a predetermined binary decision diagram (BDD) size threshold;

means for selecting an effective reachability algorithm for the circuit from among the plurality of reachability algorithms according to a comparison of results of the plurality of traces with each other;

means for generating a set of initial states for the selected effective reachability algorithm using states reached in the plurality of traces; and means for executing the selected effective reachability algorithm using the generated set of initial states to verify the circuit.

* * * * *

UNITED STATES PATENT AND TRADEMARK OFFICE
CERTIFICATE OF CORRECTION

PATENT NO.         : 7,281,225 B2
APPLICATION NO. : 10/996706
DATED              : October 9, 2007
INVENTOR(S)        : Jawahar Jain et al.

It is certified that error appears in the above-identified patent and that said Letters Patent is hereby corrected as shown below:

Column 4, Line 13, after "Sx$\Sigma$x" delete "$S^m$" and insert -- S' --.

Signed and Sealed this

Twenty-first Day of October, 2008

JON W. DUDAS
*Director of the United States Patent and Trademark Office*